(12) United States Patent
Diana et al.

(10) Patent No.: US 10,193,035 B2
(45) Date of Patent: Jan. 29, 2019

(54) LUMINANCE PATTERN SHAPING USING A BACK-EMITTING LED AND A REFLECTIVE SUBSTRATE

(71) Applicant: Lumileds LLC, San Jose, CA (US)

(72) Inventors: Frederic Stephane Diana, Santa Clara, CA (US); Erno Fancsali, Heusden-Zolder (BE); Thierry De Smet, Sunnyvale, CA (US); Gregory Guth, San Jose, CA (US); Yourii Martynov, Geldrop (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/510,999

(22) PCT Filed: Sep. 22, 2015

(86) PCT No.: PCT/US2015/051370
§ 371 (c)(1),
(2) Date: Mar. 13, 2017

(87) PCT Pub. No.: WO2016/048971
PCT Pub. Date: Mar. 31, 2016

(65) Prior Publication Data
US 2017/0279016 A1  Sep. 28, 2017

Related U.S. Application Data

(60) Provisional application No. 62/053,951, filed on Sep. 23, 2014.

(51) Int. Cl.
*H01L 33/00* (2010.01)
*H01L 33/60* (2010.01)
(Continued)

(52) U.S. Cl.
CPC .............. *H01L 33/60* (2013.01); *H01L 33/50* (2013.01); *H01L 33/486* (2013.01);
(Continued)

(58) Field of Classification Search
CPC ....... H01L 33/60; H01L 33/50; H01L 33/486; H01L 33/505; H01L 2933/0091; H01L 33/58; H01L 33/54
(Continued)

(56) References Cited

U.S. PATENT DOCUMENTS 7,222,993 B2    5/2007  Kikuchi et al.
7,293,908 B2 *  11/2007 Beeson ............. G02F 1/133603
                                                    257/290

(Continued)

FOREIGN PATENT DOCUMENTS

| JP | 2013115088 A | 6/2013 |
| WO | 2009074919 A1 | 6/2009 |
| WO | 2009074944 A1 | 6/2009 |

OTHER PUBLICATIONS

EPO as ISA, "International Search Report and Written Opinion" dated Jul. 1, 2016 from International Application No. PCT/IB2015/051370, filed Sep. 22, 2015, 13 pages.

*Primary Examiner* — Thinh T Nguyen
(74) *Attorney, Agent, or Firm* — Volpe and Koenig, P.C.

(57) ABSTRACT

A light emitting structure includes a packaged back-emitting light emitting device mounted on a reflective substrate. The properties of the reflective surface may be controlled to provide a desired luminance pattern. In this manner, the creation of a light emitting structure that provides a desired luminance pattern may be independent of the provider of the packaged light emitting device.

14 Claims, 7 Drawing Sheets

NORMALIZED LIGHT INTENSITY. Phi = 0 DEG.

(51) Int. Cl.
*H01L 33/50* (2010.01)
*H01L 33/48* (2010.01)
*H01L 33/54* (2010.01)
*H01L 33/58* (2010.01)

(52) U.S. Cl.
CPC ............ *H01L 33/505* (2013.01); *H01L 33/54* (2013.01); *H01L 33/58* (2013.01); *H01L 2933/0091* (2013.01)

(58) Field of Classification Search
USPC ...... 257/98, 99, 95, E33.05; 438/22, 25, 26, 438/27, 29
See application file for complete search history.

(56) References Cited

U.S. PATENT DOCUMENTS

| | | |
|---|---|---|
| 7,339,200 B2 | 3/2008 | Amano et al. |
| 7,626,210 B2 | 12/2009 | Shchekin et al. |
| 8,755,005 B2 | 6/2014 | Bierhuizen et al. |
| 2007/0086211 A1* | 4/2007 | Beeson ............. G02F 1/133603 362/628 |
| 2008/0170143 A1* | 7/2008 | Yoshida ............ H01L 27/14621 348/294 |
| 2010/0098377 A1 | 4/2010 | Meir |
| 2010/0258831 A1* | 10/2010 | Jagt ........................ H01L 33/46 257/98 |

\* cited by examiner

LUMINANCE PATTERN SHAPING USING A BACK-EMITTING LED AND A REFLECTIVE SUBSTRATE

CROSS-REFERENCE TO RELATED APPLICATIONS

The present application is a § 371 application of International Application No. PCT/US2015/051370 filed on Sep. 22, 2015 and entitled "LUMINANCE PATTERN SHAPING USING A BACK-EMITTING LED AND A REFLECTIVE SUBSTRATE," which claims the benefit of U.S. Provisional Patent Application No. 62/053,951, filed Sep. 23, 2014. International Application No. PCT/US2015/051370 and U.S. Provisional Patent Application No. 62/053,951 are incorporated herein.

FIELD OF THE INVENTION

This invention relates to the field of light emitting devices, and in particular to a light emitting structure that facilitates obtaining a desired light emission pattern using a back-emitting light emitting device and a reflective substrate.

BACKGROUND OF THE INVENTION

With advances in technology, semiconductor light emitting devices are being used in a variety of applications, including home lighting, area lighting, vehicular lighting, and so on. Within these applications, particular luminance patterns may be desired to optimize the efficiency or effectiveness of the provided illumination.

The illumination (luminous intensity, luminance pattern) of a conventional light emitting device is generally Lambertian with respect to a normal to the emission surface. In the creation of a light emitting structure that provides a desired illumination that is not Lambertian, an optical element is used to convert the Lambertian luminance pattern into the desired luminance pattern.

For example, a "flashlight" application may employ a Fresnel lens that collimates the Lambertian luminance into a luminance pattern having a narrow beamwidth, thereby concentrating the light in a direction orthogonal to the lens.

Figure 1A:
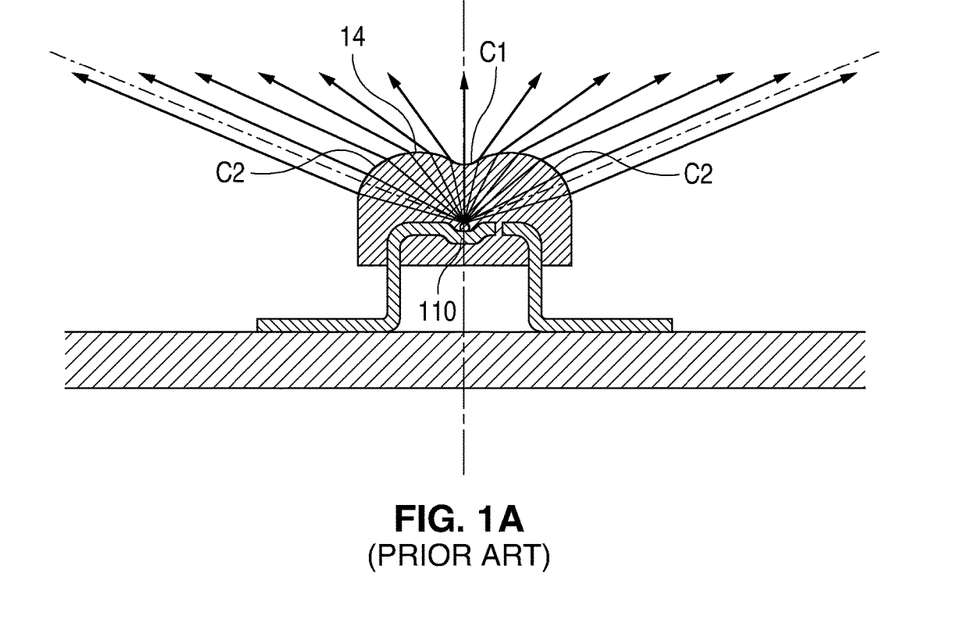
FIGS. 1A-1B illustrate an example prior art light emitting structure that provides a desired luminance pattern using optical elements to shape the emitted light.

In automotive applications, such as a headlight, an elongated luminance pattern may be desirable such that the luminance pattern has a somewhat broad beamwidth in one dimension (across the roadway) and a narrow beamwidth in the other dimension (above the roadway). FIG. 1A illustrates a cross-section profile of a "peanut-shape" optical lens 14 as disclosed in U.S. Pat. No. 7,339,200, "LIGHT-EMITTING DIODE AND VEHICULAR LAMP" issued to Amano et al., 4 Mar. 2008, and incorporated by reference herein. In the longitudinal direction, the lens comprises two convex lens section C2 on either side of a concave lens section C1. This combination of lens sections serves to disperse the light emitted by the LED 110, and provides the luminance pattern 150 of FIG. 1B with two peaks at a given angle off from the normal of the light emitting surface. The various dimensions of the optical lens 14 with respect to the location of the LED 110 determine the location (angle off normal) and magnitude of these peaks, as well as the magnitude of the luminance in the 'valley', normal to the light emitting surface.

Although the costs of molding or otherwise forming an optical lens that creates a desired luminance pattern may be slight, increasing competitive pressures in the field of semiconductor light emitting devices often require cost reductions wherever feasible.

Additionally, for cost effectiveness and other considerations, the forming of the desired optical lens is generally performed during the 'packaging' phase of manufacturing the light emitting structure, thereby requiring that the manufacturer of the light emitting structure be involved in creating a lens that provides the desired luminance pattern.

SUMMARY OF THE INVENTION

It would be advantageous to provide a light emitting structure that enables creation of a desired luminance pattern without the use of an optical lens. It would also be advantageous to enable creation of a desired luminance pattern as a 'post packaging' process, thereby enabling a customization of the luminance pattern by purchasers of a packaged light emitting device.

To better address one or more of these concerns, in an embodiment of this invention, the light emitting structure includes a packaged light emitting device mounted on a reflective substrate, wherein the properties of the reflective surface may be controlled to provide a desired luminance pattern. In this manner, the creation of a light emitting structure that provides a desired luminance pattern may be independent of the provider of the packaged light emitting device.

The packaged light emitting device may be a light emitting device that provides a luminance pattern that includes a substantial side emission, including both upward and backward luminance intensity components at angles beyond ninety degrees off normal (i.e. toward the substrate) so that the properties of the reflective substrate may be used to affect this luminance in a desired manner.

An example back-emitting light emitting device includes a light emitting element having a light emitting surface, a reflector having a reflective surface opposite the light emitting surface, and a spacer element that separates the reflective surface from the light emitting surface. The spacer element provides a separation distance between the reflective surface and the light emitting surface such that about half or more of the light emitted from the device is emitted at angles greater than 90 degrees from a normal to the light emitting surface toward the reflector. In an embodiment, the separation distance is between 500 and 1000 um.

The reflective substrate may be at least an order of magnitude larger in area than the light emitting device, and may be substantially diffuse reflective, specular reflective, or a combination of both. In an example embodiment, the light emitting device may be surrounded by a specular reflective block situated upon a diffuse reflective substrate. The reflective substrate may also include conductors coupled to the light emitting element.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 2A:
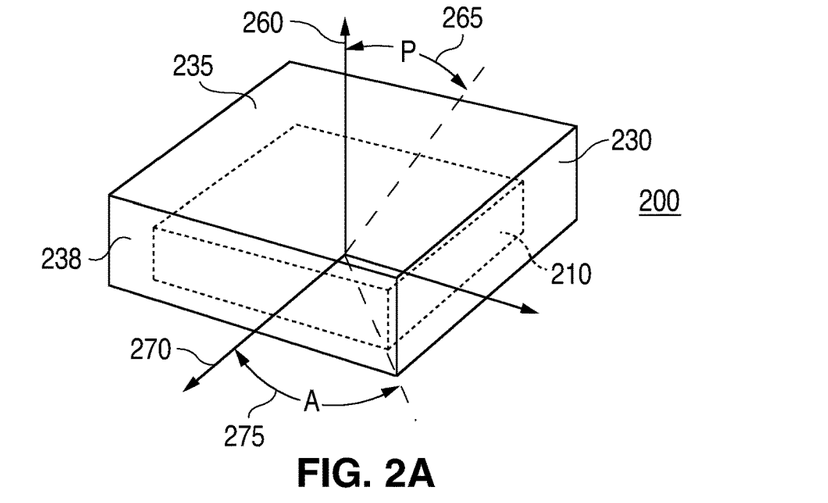
FIGS. 2A-2C illustrate an example prior art PSS-CSP (Patterned Sapphire Substrate Chip Scale Package) and its luminance pattern.
Figure 2B:
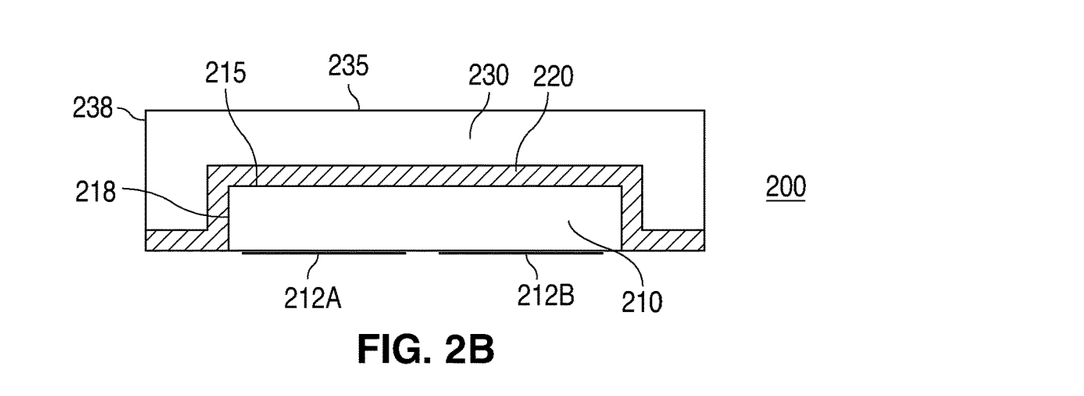
Figure 2C:
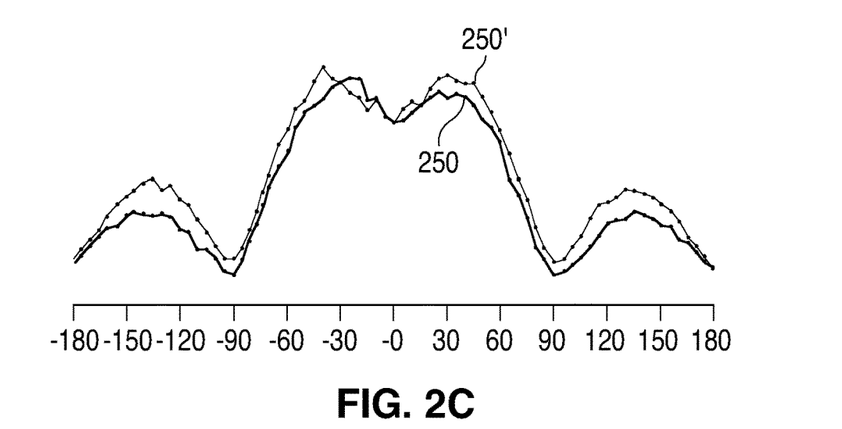

FIGS. 2A-2C illustrate an example prior art PSS-CSP (Patterned Sapphire Substrate Chip Scale Package) light emitting device 200 and its luminance pattern. The device 200 of FIGS. 2A-2B includes a chip scale light emitting element 210 with a light emitting surface 215, and an optional wavelength conversion layer 220 upon this light emitting surface 215. Some light may be emitted from the sides 218 of the light emitting element 210, and the wavelength conversion layer 220 may also encase these sides 218. Contacts 212A and 212B on the light emitting element 210 provide for external connections to the light emitting element 210.

A transparent protective layer 230 may be provided to encase the light emitting element 210 and optional wavelength conversion layer 220. Light will be emitted from the top surface 235, as well as from the side surfaces 238 of the protective layer 230. In this example embodiment, the protective layer 230 is a 250 um thick sapphire structure, although other transparent material, such as silicone, may be used.

A normal 260 is defined as the normal to the plane of side 235. Angle P 265 is measured from the normal 260. A normal 270 is defined as the normal to the plane of side 238. Typically the angle between normal 260 and normal 270 is 90 degrees. Angle A 275 is the angle measured from normal 270 to one of the two closed corners on the device i.e. 45 degrees for rectangular shaped device.

Two example luminance patterns 250, 250' are illustrated in FIG. 2C, with +/−180 degrees from normal illustrated on the horizontal axis. Luminance pattern 250 is the cross-section of the angular light output distribution as a function of the polar, or elevation angle P 265 (FIG. 2A) measured from the normal 260 of surface 235 for the fixed azimuth angle 270 of zero degrees. That is, the graph shows the luminance when angle P 265 is swept from +180 to −180 in a plane parallel to side 238. The fixed azimuth angle 270 is defined as the angle normal to surface 238 (or equivalently, normal to any other side surface by symmetry). Luminance pattern 250' is the cross-section of the angular light output distribution for the fixed azimuth angle A 275 of 45 degrees with respect to surface 238 (equivalently, as viewed toward each corner of the device by symmetry).

As can be seen, most of the light is emitted within about +/−60° normal to the respective surfaces. As noted above, while this emission pattern may be suitable for many applications, there are applications that require substantially different emission patterns, such as the multi-lobe radiation pattern of FIG. 1B, wherein the magnitude and location (emission angle) of the lobes and the magnitude of the valley between the lobes may vary for the different applications.

Side-emitting light emitting devices are common in the art, wherein the luminance lobes are preferably located at 90° from the normal to the light emitting surface of the light emitting element. U.S. Pat. No. 7,626,210, "LOW PROFILE SIDE EMITTING LED", issued 1 Dec. 2009 to Shchekin et al., and U.S. Pat. No. 8,755,005, "THIN EDGE BACKLIGHT WITH LEDS OPTICALLY COUPLED TO THE BACK SURFACE", issued 17 Jun. 2014 to Bierhuizen et al., each incorporated by reference herein, disclose side-emitting LEDs comprising a waveguide that is sandwiched between a light emitting element and a diffuse reflector. Light is reflected within the light guide until it eventually escapes from the side edge of the waveguide.

In accordance with an aspect of this invention, a similar structure is used to create a back-emitting light emitting device. As the term is used herein, a back-emitting light emitting device is a device wherein at least half of the emitted light is emitted at an angle greater than 90 degrees from a normal to the light emitting surface of the light emitting source in the direction of the emitted light.

Figure 3A:
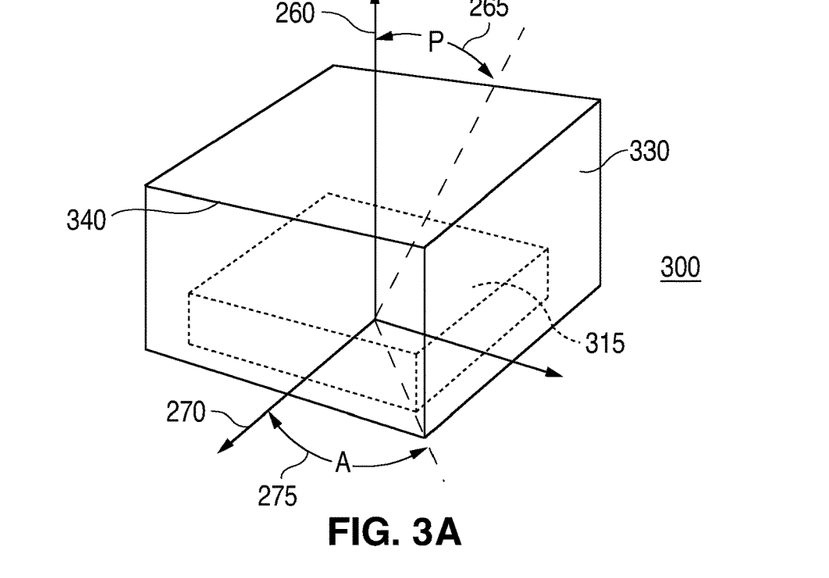
FIGS. 3A-3C illustrate an example light emitting device having a luminance pattern that includes a substantial luminance intensity at angles beyond ninety degrees off normal.
Figure 3B:
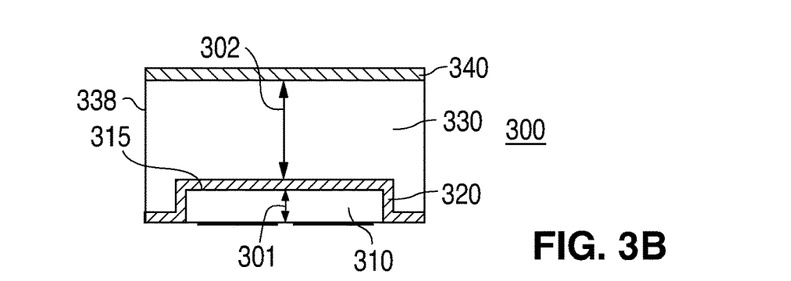

FIGS. 3A-3B illustrate an example back-emitting light emitting device 300 having a luminance pattern that includes a substantial luminance intensity at angles beyond ninety degrees off normal.

The light emitting device 300 includes a light emitting element 310, which in this embodiment is similar to the PSS-CSP light emitting element 210 of FIG. 2B. One of skill in the art will recognize, however, that the particular structure of the light emitting element 310 is not material to this invention, and any suitable light emitting structure may be used.

The light emitting element 310 may be a 'direct color' (including blue, green, yellow, UV, red, deep-red, etc.) light emitting element, and/or an optional wavelength conversion layer 320 may be included to emit light of a different color. A diffuse reflector 340 is situated directly above the light emitting element 310, separated from the light emitting element 310 by a relatively thick transparent spacer element 330. In one example, the thickness 301 of the light emitting element is about 250 um, and the wavelength conversion layer 320 is about 75 um thick and the transparent space is about 500-1000 um. Typically the ratio between the light emitting element thickness 301 and the transparent space thickness 302 is between 2:1 and 4:1.

The substrate upon which the light emitting element 310 is grown, or a substrate upon which the light emitting element 310 is bonded, may form the spacer element 310, and may be, for example, a sapphire substrate. In an example embodiment, the substrate/spacer 330 may include recesses within which the light emitting element 310 is grown, or within which the light emitting element 310 is bonded. If the substrate/spacer 330 does not include a recess, a protective material, such as a silicone layer may be situated around the perimeter of the light emitting element 310. This protective material may be reflective, to direct light toward the substrate/spacer 330.

Figure 3C:
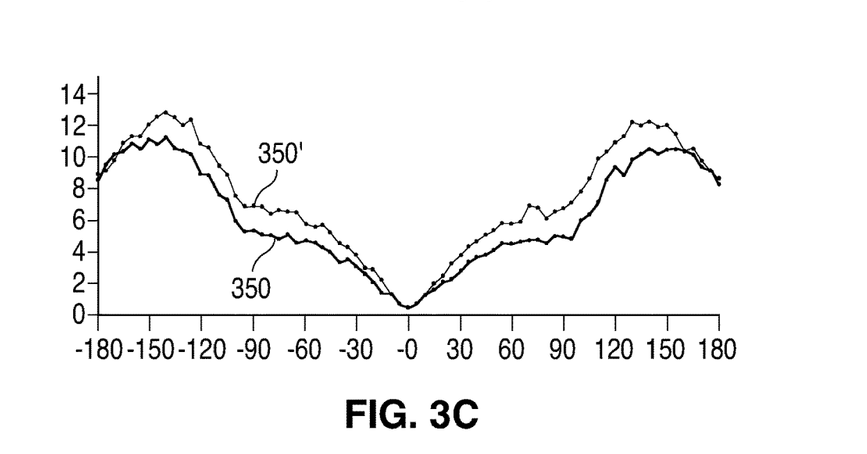

The structure of the light emitting device 300 provides a luminance patterns 350, 350' such as illustrated in FIG. 3C. Pattern 350 is the luminance pattern as viewed according normal 270 to a wall surface of the device 300, and pattern 350' is the luminance pattern as viewed at an angle A 275, toward a corner of the device 300.

For ease of presentation and understanding, the subsequent details regarding luminance patterns will address the luminance pattern as viewed from a normal 270 to the surface of the wall, although both luminance patterns will be illustrated. That is, the patterns identified with "un-primed" numerals 350, 450, 550, 650, 750, 850 are the luminance patterns as viewed from a normal 270, whereas the patterns identified by the "primed" numerals, 350', 450', 550', 650', 750', 850' are the luminance patterns as viewed from angle A 275, toward a corner of the device 300, Of particular note, the light emitting device 300 provides a substantial luminance at angles greater than 90° from a normal to the light emitting surface 315 of the light emitting element. This is due to the fact that although the diffuse reflector 340 reflects the light at various angles, virtually all of these angles are in the 'downward' direction (i.e. toward the plane of the light emitting surface 315), and the spacer element 330 is tall enough to enable a substantial amount of the reflected light to directly exit the spacer element 330 without further reflections within the device 300. The exterior walls of the spacer layer 330 may be roughened to enhance light extraction through these walls.

The luminance at angles +/−90° is primarily the light from the light emitting element 301 that escapes from the exterior walls of the spacer layer directly, or light from the diffuse reflector 340 that is reflected within the spacer element 330 and redirected toward the exterior walls in a 'upward' direction.

The diffuse reflector 340 may be a layer of TiOx that provides at least 95% reflectance and 5% transmittance. A TiOx thickness of 100 um may provide a reflectance of at least 99%, with transmittance of less than 1%. A thinner layer, or a different material, may be used if additional luminance is desired normal to the light emitting surface 315.

The back-emitting luminance pattern 350 of the device 300 provides an opportunity to use the reflective characteristics of the substrate (not shown) upon which the light emitting device 300 is mounted to shape the emissions into the desired luminance pattern for each particular application.

Figure 4A:
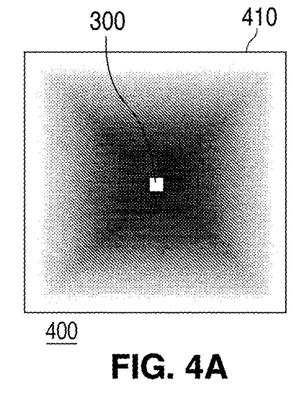
FIGS. 4A-4B illustrate an example light emitting structure that includes a specular reflective substrate and its luminance pattern.
Figure 4B:
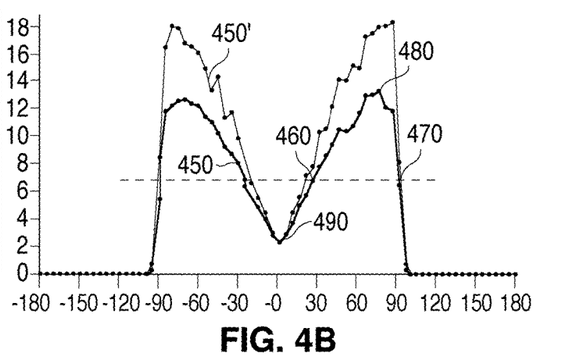

FIGS. 4A-4B illustrate an example light emitting structure 400 that includes a specular reflective substrate 410. Illuminance patterns 450, 450' are the output of the light emitting structure 400. The example substrate 410 is at least five times larger than the light emitting device 300, preferably an order of magnitude larger than the light emitting device 300. In the examples herein, the light emitting device 300 is about 1 mm×1 mm, and the substrate 410 is about 25 mm×25 mm. In the example structure 400, the entire surface area of the substrate 410, except for a 1.5 mm×1.5 mm area (not illustrated) beneath the light emitting device 300 is specular reflective, using for example, a thin layer of silver that is polished to a near 'mirror-finish'. Other material, such as metal films, foils, aluminum- or silver-aluminum-based, or organic-DBR-based mirror sheets (e.g. 3M ESR) may also be used. The 1.5 mm×1.5 mm area beneath the 1 mm×1 mm device 300 is provided to electrically insulate the device 300 from the specular reflective material on the surface of the substrate 410. This insulating/exposed area may be minimized to increase the specular reflective area. A non-conducting reflective material, such as a white solder mask (WSM) material may be used to cover the exposed area around the perimeter of the device 300.

The structure 400, includes a 25 mm×25 mm mirror-finish reflective substrate with a 1.5 mm×1.5 mm diffusely reflective WSM area about a back-emitting device 300. In this example, and each of the following examples, the reflective surface 340 (FIG. 3B) of device 300 provides 95% reflectance and 5% transmittance. As noted above, the back-emitting device 300 provides a substantial luminance at angles greater than 90° from a normal to the light emitting surface 315 of the light emitting element (FIG. 3C). Accordingly, the reflective substrate 410 receives and reflects a substantial luminance in the 'upward' direction, away from the plane of the substrate 410. The structure 400 provides the example luminance patterns 450, 450' of FIG. 4B. As can be seen, the structure 400 exhibits strong side emissions, with a FWHM (Full Width at Half Maximum) of about 30° to 90° (460-470). The luminance 490 at 0°, normal to the light emitting surface, is about 15% of the maximum luminance 480, at about 70°.

Figure 1B:
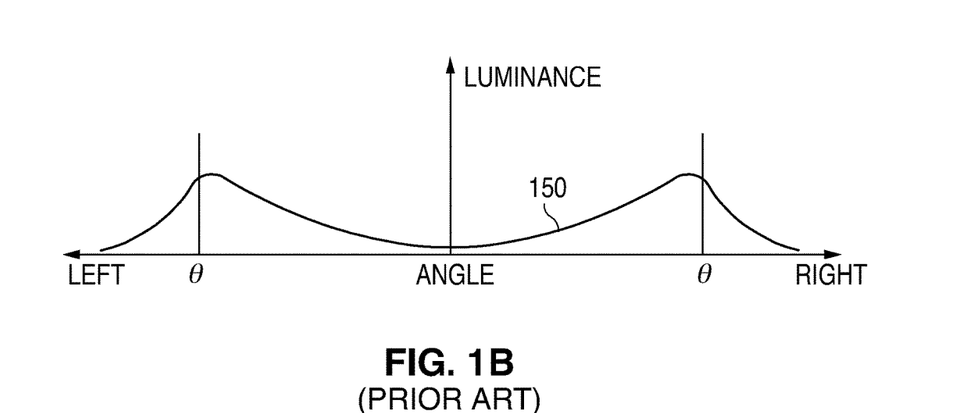

It is significant to note that this multi-lobe luminance pattern 450 has been achieved without a discrete optical lens, such as the lens 14 of FIG. 1A that provides the multi-lobe luminance pattern 150 of FIG. 1B.

As noted above, different applications may require different luminance patterns. By controlling the reflective characteristics of the substrate, the shape of the luminance pattern may be changed.

Figure 5A:
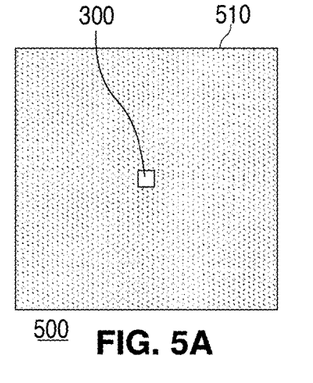
FIGS. 5A-5B illustrate an example light emitting structure that includes a diffusing reflective substrate and its luminance pattern.
Figure 5B:
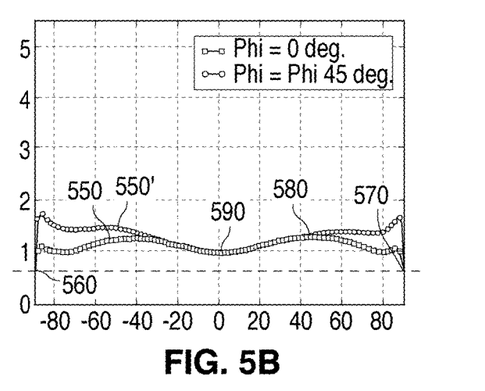

FIGS. 5A-5B illustrate an example light emitting structure 500 that includes a light emitting device 300 mounted on a 25 mm×25 mm substrate 510 that is coated with a diffuse reflective material, such as WSM, and its luminance patterns 550, 550'.

The structure 500, including a 25 mm×25 mm WSM diffuse reflective substrate and a back-emitting device 300 provides the example luminance patterns 550, 550' of FIG. 5B. (As in FIG. 4B, the luminance pattern 550 has minimal emissions beyond +/−90°. This luminance pattern 550 and subsequent luminance patterns only illustrate emissions within +/−90°.) As can be seen, the structure 500 also exhibits side emissions, but the shape of the luminance patterns 550, 550' are substantially 'rounded' and substantially less peaked than the luminance patterns 450, 450' produced by the structure 400 of FIG. 4A.

The luminance pattern 550 produced by the structure 500 exhibits a FWHM of −90° to 90° (560-570). The luminance 590 at 0°, normal to the light emitting surface, is about 80% of the maximum luminance 580 at about 50°.

As can be seen, substantially different luminance patterns 550, 550' are produced by the back-emitting device 300 when the device 300 is situated on a diffusely reflective substrate 510 as compared to the patterns 450, 450' produced when the device 300 is situated on a specular reflective substrate 410.

It is significant to note that these different luminance patterns 450, 550 (450', 550') were produced by controlling the reflective characteristics of the substrate 410, 510 surrounding the same light emitting device 300. Accordingly, each provider of a light emitting structure comprising a reflective substrate and the device 300 may provide a desired luminance pattern without having to interact with the provider of the device 300, and without having to create a special purpose optical lens, such as illustrated in FIG. 1A.

To obtain a desired luminance pattern between the specular reflective structure 400 and diffuses reflective structure 500, a mix of specular and diffuse reflectance may be used.

Figure 6A:
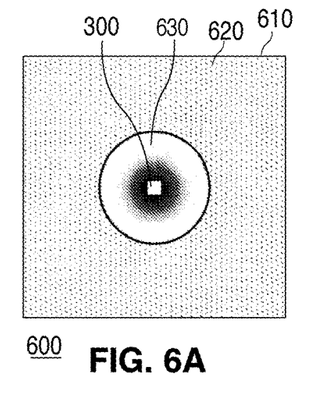
FIGS. 6A-6B illustrate an example light emitting structure having a reflective substrate with a diffusing reflective region and a specular reflective region and its luminance pattern.
Figure 6B:
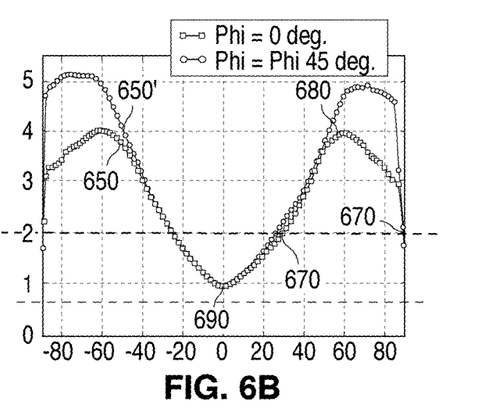

FIGS. 6A-6B illustrate an example light emitting structure 600 having a back-emitting light emitting device 300 mounted on a reflective substrate 610 with a diffusing reflective region 620 and a specular reflective region 630, and its luminance patterns 650, 650'. As in the example structure 600, a 1.5 mm×1.5 mm region (not illustrated) surrounds the 1 mm×1 mm device 300 to isolate the device 300 from the specular reflective region 630, and may include a diffuse reflective material, such as WSM. The diffusing reflective region 620 extends to the perimeter of the substrate 610, and the specular reflective region 630 is a 10 mm diameter circular specular region.

FIG. 6B illustrates example luminance patterns 650, 650' provided by the structure 600. As contrast to the luminance patterns 450 and 550, the luminance pattern 650 produced by the structure 600 exhibits a FWHM of about 30° to 90° (660-670). The luminance 690 at 0°, normal to the light emitting surface, is about 25% of the maximum luminance 680 at about 60°.

Figure 7A:
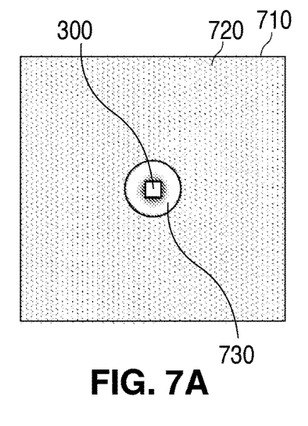
FIGS. 7A-7B illustrate another example light emitting structure having a reflective substrate with a diffusing reflective region and a specular reflective region and its luminance pattern.

FIG. 7A illustrates an example light emitting structure 700 having a reflective substrate 710 with a diffuse reflective region 720, a specular reflective region 730, and a back-emitting device 300 surrounded by a 1.5 mm×1.5 mm diffuse reflective region (not illustrated). The diffusing reflective region 720 extends to the perimeter of the substrate 710, and the specular reflective region 730 is a 5 mm diameter circular specular region.

Figure 7B:
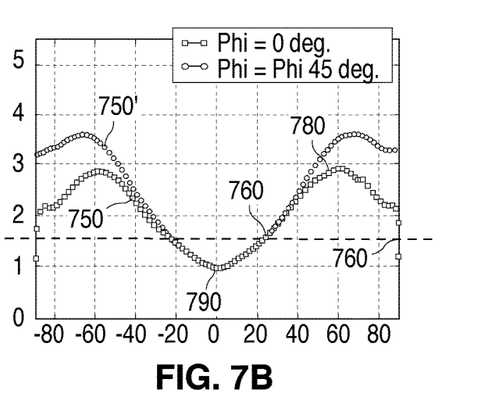

FIG. 7B illustrates example luminance patterns 750, 750' provided by the structure 700. As contrast to the luminance patterns 450, 550, 650, the luminance pattern 750 produced by the structure 700 exhibits a FWHM of about 20° to 90° (760-770). The luminance 790 at 0°, normal to the light emitting surface, is about 35% of the maximum luminance 780 at about 60°.

Other combinations and arrangements of reflective regions on the substrate to create a desired luminance pattern will be evident to one of skill in the art in view of this disclosure.

Figure 8A:
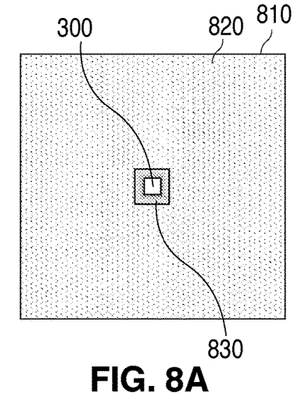
FIGS. 8A-8C illustrate an example light emitting structure having a light emitting device mounted upon a reflective interposer that is mounted upon a diffuse reflective substrate and its luminance pattern.
Figure 8B:
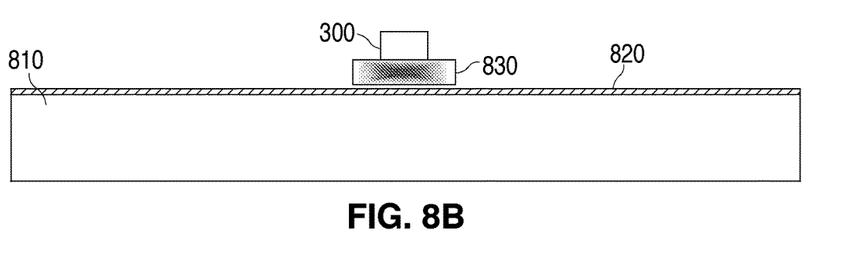
Figure 8C:
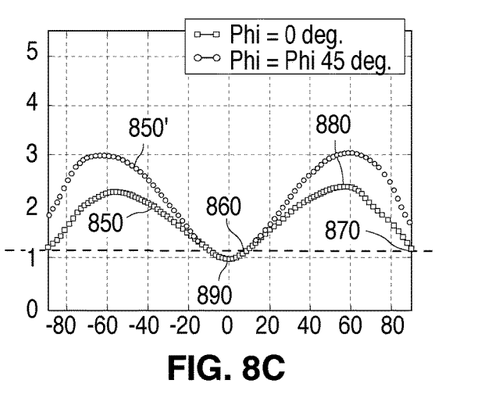

FIGS. 8A-8C illustrate an example light emitting structure 800 having a light emitting device 300 mounted upon a reflective interposer 830, and its luminance patterns 850, 850'. FIG. 8A shows a top view of this arrangement while FIG. 8B shows a side view.

The reflective interposer 830 is mounted upon a substrate 810. The mounting surface of substrate 810 includes a diffuse reflective coating 820 over some or all of the mounting surface. In this example, the reflective interposer 830 has a specular reflective surface of about 3.5 mm×3.5 mm, and may be a silver coated ceramic block of about 600 mm thickness.

FIG. 8C illustrates an example luminance pattern 850 provided by the structure of FIG. 8A. As contrast to the luminance patterns 450, 550, 650, 750, the luminance pattern 850 produced by the structure 800 exhibits a FWHM of about 5° to 90° (860-870). The luminance 890 at 0°, normal to the light emitting surface, is about 40% of the maximum luminance 880 at about 55°.

As detailed above, the choice of the reflective surface upon which the back-emitting light emitting device 300 is situated provides luminance patterns having different characteristics, without the use of secondary optics.

Figure 9:
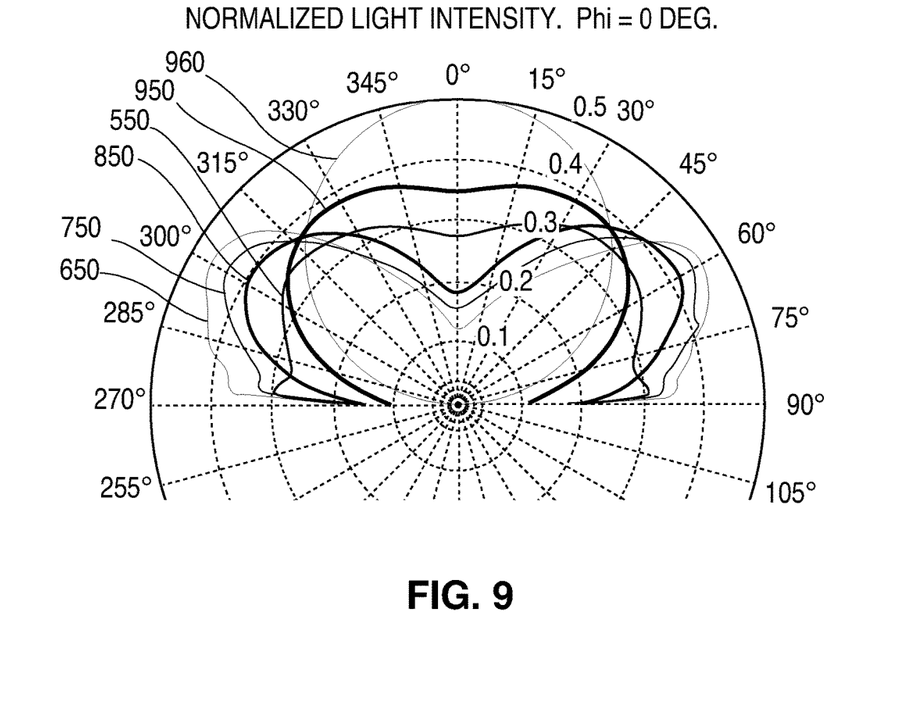
FIG. 9 illustrates a polar plot of the luminance patterns of the above light emitting structures.

FIG. 9 illustrates a polar plot of the luminance patterns 550, 650, 750, and 850. FIG. 9 also includes a polar plot of the luminance pattern 960 of a conventional light emitting device having a Lambertian pattern, and a polar plot of a luminance pattern 950 of a conventional light emitting device situated on a reflective interposer, such as the interposer 830 of FIGS. 8A-8B.

As can be seen, placing a conventional light emitting device on a reflective interposer provides a luminance pattern 950 with reduced emissions in the normal direction, and increased emissions from the side, compared to the Lambertian pattern 960. However, the pattern 950 does not exhibit the substantial side lobes of the patterns 650, 750, and 850.

Situating a back-emitting device 300 on a diffuse reflector provides a luminance pattern 550 that has more side emissions than the luminance pattern 950 of a conventional light emitting device situated on a reflective interposer, but a substantial amount of light is also emitted in the normal direction.

The specular reflectors of structures 600, 700, and 800 provide noticeable side lobes, with reduced emissions in the normal direction. As can be seen from luminance patterns 750 and 650 increasing the area of specular reflective material (5 mm circle, 10 mm circle, respectively) increases the side lobe intensities, and decreases the emissions in the normal direction. This is due to the fact that the light emitted from the back-emitting device 300 is emitting 'down' and 'away from' the back-emitting device 300. Light that strikes the specular reflector at increasing distances from the back-emitting device strikes the reflector at decreasingly shallow angles (increasing away from normal) and is consequently reflected at these decreasingly shallow angles. Conversely, if the light strikes a diffuse reflector at a shallow angle, only a portion of the light will be reflected at a shallow angle.

In addition to controlling the luminance pattern by controlling the area of specular reflection, the geometry of the diffuse and specular reflective surfaces also changes the overall shape of the luminance pattern, as illustrated by the luminance pattern 850 of an elevated specular reflector over a diffuse reflector.

One of skill in the art will also recognize that different structures may be used to create a back-emitting light emitting device, with different emission characteristics, and correspondingly different reflective characteristics with respect to the reflective substrate upon which it is mounted.

Figure 10:
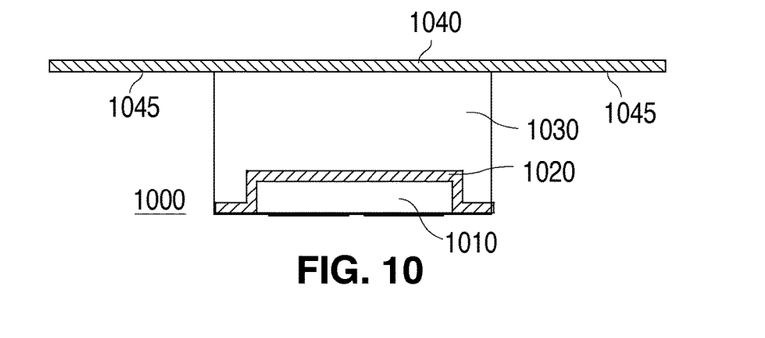
FIG. 10 illustrates another example light emitting device having a luminance pattern that includes a substantial luminance intensity at angles beyond ninety degrees off normal.

FIG. 10 illustrates another example of a back-emitting light emitting device 1000. The light emitting device 1000 includes a light emitting element 1010, which may be similar to the light emitting element 210 of FIG. 2A. An optional wavelength conversion layer 1020 may cover the light emitting element 1010. An 'oversize' reflector 1040 is situated over the light emitting element 1010, separated from the light emitting element 1010 by a transparent layer 1030.

The reflector 1040 is illustrated as being about three times the width of the light emitting element 1010, although other sizes may be used, depending upon the desired luminance pattern from the light emitting device 1000.

The transparent layer 1030 is illustrated as being narrower than the reflector 1040, creating an overhang region 1045 of the reflector 1040. One of skill in the art will recognize that the transparent layer 1030 could be the same size as the transparent layer 1040, again depending upon the desired luminance pattern from the light emitting device 1000.

The reflector 1040 may be diffuse reflective or specular reflective, and in some embodiment, a combination of diffuse and specular reflective regions may be used. For example, the region directly above the light emitting element 1010 may be diffuse reflective with a transmittance that may be controlled by controlling the thickness or composition of the material used to form this diffuse reflective region. The region 1045, beyond the extent of the light emitting element 1010, may be specular or diffuse reflective, each providing a different luminance pattern from the light emitting device 1000.

Figure 11:
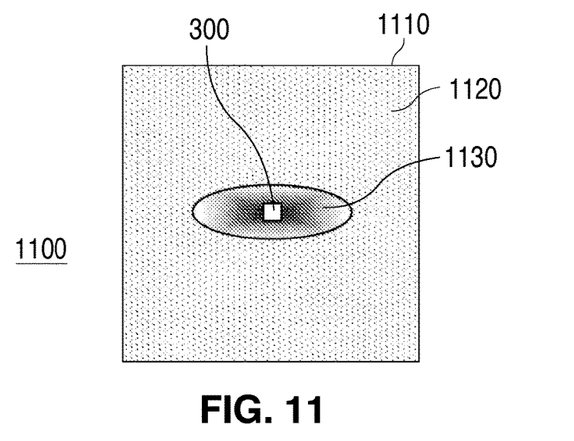
FIGS. 11-13 illustrate other example reflective patterns on a substrate.
Figure 12:
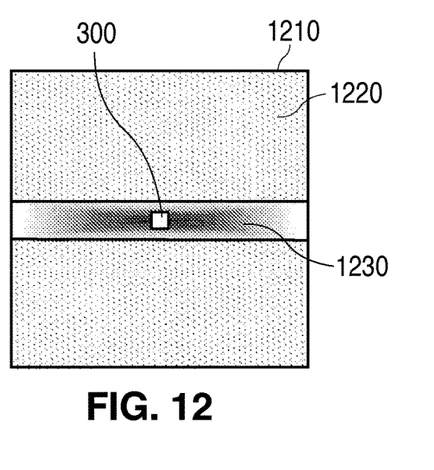

In each of the above embodiments, a symmetric reflective pattern on the substrate below the light emitting element is illustrated, generally producing a symmetric luminance pattern. However, as noted above, some applications require an asymmetric luminance pattern with respect to the axes. FIGS. 11-12 illustrate example reflective patterns on a substrate that produces an elongated luminance pattern.

In FIG. 11, an oval specular reflective region 1130 is situated in the center of diffuse reflective region 1120 on substrate 1110. The luminance pattern in the plane of the longer axis may appear similar to that of FIG. 6B (wide specular region), while in the shorter axis may appear similar to that of FIG. 7B (narrower specular region).

In FIG. 12, a specular reflective strip 1230 bisects diffuse reflective region 1220 on substrate 1210. In the longer dimension, the luminance pattern may appear similar to FIG. 4B, while in the shorter dimension, the luminance pattern may appear similar to FIG. 8C.

Figure 13:
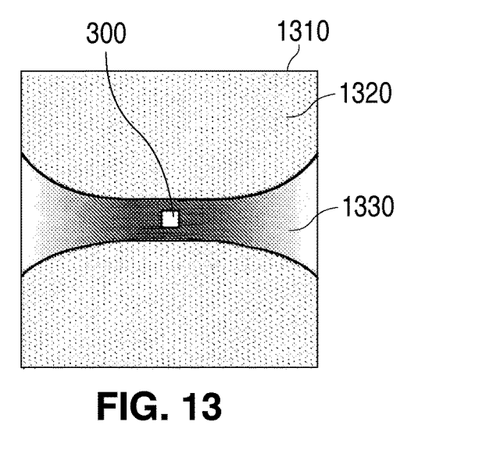

In FIG. 13, the substrate 1310 includes a diffuse reflective region 1320 and a specular reflective strip 1330 that increases in width farther from the center of the substrate 1310, which may compensate for reduced luminance in the longer dimension as the distance from the light emitting device 300 increases.

These and other patterns to achieve a desired luminance pattern are also feasible, and will be evident to those skilled in the art in view of this disclosure.

Although this invention has been disclosed and illustrated using a device with a single reflective surface opposite the light emitting element, one of skill in the art will recognize that additional reflective surfaces may be provided to further shape the light emission pattern.

That is, in the examples provided, the light emission pattern is symmetric about the vertical axis, and similar in each dimension. If, on the other hand, two opposing sides of the device were reflective, the light emission pattern in one dimension would be as illustrated in FIGS. 4B, 5B, 6B, 7B, and 8C, but occluded in the other dimension. If the two reflective sides were adjacent, the light emission pattern in both dimension would be asymmetric with respect to normal. If three sides of the device were reflective, the light emission pattern would be limited to a quadrant and occluded in the other three quadrants.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the reflective layer 340 in the light emitting device 300 is specular reflective, instead of diffuse reflective. In such an embodiment, a dichroic filter may be situated between the light emitting element 310 and the transparent layer 330, such that light from the light emitting element 310 may be transmitted through the filter, but light reflected from the reflective layer 340 is reflected back toward the reflective layer 340 and not absorbed in the light emitting element 310.

In like manner, other techniques used to improve light output efficiency may be applied as well. For example, the sidewalls of the transparent layer 330 may be roughened or textured to improve the light output efficiency. In some embodiments, the sides of the transparent layer 330 are shaped so as to increase or decrease the amount of light that is back-emitted from the light emitting device 300.

Similarly, although the invention is disclosed wherein a 1.5 mm×1.5 mm area surrounds a 1 mm×1 mm light emitting device to insulate the light emitting device from the potentially conductive specular reflective regions, one of skill in the art will recognize that other insulation techniques may be used, to allow an entire surface around the light emitting device to specular reflective, or a non-conductive specular reflective material may be used.

In like manner, although the transparent layer 330 in the example embodiments is configured to surround the perimeter of the light emitting element 310, one of skill in the art will recognize that the transparent layer 330 (and the optional wavelength conversion material 320) need not extend beyond the extent of the light emitting element 310. In such an embodiment, a protective material, which may be reflective, may surround the perimeter of the light emitting element 310.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting structure, comprising:
   a light emitting device comprising:
   a light emitting element having a light emitting surface,
   a reflector having a reflective surface opposite the light emitting surface, and
   a spacer element that separates the reflective surface from the light emitting surface, wherein the spacer element has a thickness that provides a separation distance between the reflective surface and the light emitting surface such that at least half of the light emitted from the device is emitted at an angle greater than 90 degrees from a normal to the light emitting surface toward the reflector, and
   a reflective substrate upon which the light emitting element is situated, the reflective substrate being at least five times larger than the reflector.

2. The structure of claim 1, wherein the reflective surface is substantially diffuse reflective.

3. The structure of claim 1, further comprising a wavelength conversion layer situated between the light emitting element and the reflector.

4. The structure of claim 1, wherein the separation distance is at least 500 um.

5. The structure of claim 1, wherein the reflective substrate is at least an order of magnitude larger than the reflector.

6. The structure of claim 1, wherein the reflective substrate is substantially diffuse reflective.

7. The structure of claim 1, wherein the reflective substrate includes an area that is substantially specular reflective.

8. The structure of claim 6, further comprising a specular reflective block between the reflective substrate and the light emitting device.

9. The structure of claim 1, wherein at least one side wall of the spacer element is reflective.

10. The structure of claim 1, wherein the reflective substrate comprises:
a specular reflective surface except for an insulating or exposed area beneath the light emitting device; and
a non-conducive reflective material covering the insulating or exposed area around the perimeter of the light emitting device.

11. The structure of claim 1, wherein the reflective substrate comprises:
a specular reflective region;
an insulating or exposed area beneath the light emitting device in the circular specular reflective region;
a diffusive reflective material covering the insulating or exposed area around the perimeter of the light emitting device; and
a diffusing reflective region around the circular specular reflective region.

12. The structure of claim 11, wherein the specular reflective region is circular or oval.

13. The structure of claim 11, wherein the specular reflective region comprises a strip of constant width or increasing width away from the center of the reflective substrate.

14. The structure of claim 1, wherein the reflector comprises a diffusive reflective region directly above the light emitting element and a specular reflective region beyond the extent of the light emitting element.

* * * * *